(12) United States Patent
Hong et al.

(10) Patent No.: US 8,670,112 B2
(45) Date of Patent: Mar. 11, 2014

(54) TESTING APPARATUS FOR TESTING LIGHT EMITTING DIODE LAMP AND METHOD FOR OPERATING THE SAME

(75) Inventors: Sungho Hong, Seoul (KR); Jang Gu Oh, Seoul (KR); Tae Young Choi, Seoul (KR); Jong Tae Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 499 days.

(21) Appl. No.: 12/985,790

(22) Filed: Jan. 6, 2011

(65) Prior Publication Data

US 2011/0228273 A1   Sep. 22, 2011

(30) Foreign Application Priority Data

Mar. 22, 2010   (KR) .................. 10-2010-0025489

(51) Int. Cl.
*G01J 1/00* (2006.01)
(52) U.S. Cl.
USPC .......................................... 356/121; 356/122
(58) Field of Classification Search
USPC ........................................................ 356/121
See application file for complete search history.

(56) References Cited

U.S. PATENT DOCUMENTS

| | | | |
|---|---|---|---|
| 3,711,038 A | * | 1/1973 | Van Otteren ................ 406/19 |
| 2003/0161163 A1 | * | 8/2003 | Hussey et al. ............... 362/487 |

FOREIGN PATENT DOCUMENTS

| | | | |
|---|---|---|---|
| JP | 5-159753 A | | 6/1993 |
| JP | 3041201 B2 | | 3/1996 |
| JP | 10-253697 A | | 9/1998 |
| JP | 2009-121990 A | | 6/2009 |
| KR | 10-1999-0080582 A | | 11/1999 |
| KR | 10-0281480 B1 | | 11/2000 |
| KR | 10-2003-0025399 A | | 3/2003 |
| KR | 10-2009-0072210 A | | 7/2009 |
| KR | 10-0931322 B1 | | 12/2009 |

* cited by examiner

*Primary Examiner* — Tarifur Chowdhury
*Assistant Examiner* — Omar Nixon
(74) *Attorney, Agent, or Firm* — McKenna Long & Aldridge, LLP

(57) ABSTRACT

Disclosed is a method for operating a test apparatus for an LED lamp. The method includes: forming a self-holding circuit by switching on a first switching means such that an up and down shifter provided in the test apparatus for the LED lamp moves down; moving down and stopping the up and down shifter from a determined initial position to a measurement position; measuring the quality of the LED lamp equipped with the test apparatus for the LED lamp; releasing the self-holding circuit by switching on the second switching means such that the up and down shifter moves up; and moving up and down shifter from the measurement position to the determined initial position.

19 Claims, 6 Drawing Sheets

TESTING APPARATUS FOR TESTING LIGHT EMITTING DIODE LAMP AND METHOD FOR OPERATING THE SAME

CROSS-REFERENCE TO RELATED APPLICATIONS

The present application claims priority under 35 U.S.C. §119(e) of Korean Patent Application No. 10-2010-0025489, filed on Mar. 22, 2010, which is hereby incorporated by reference for all purposes as if fully set forth herein.

BACKGROUND

This embodiment relates to a testing apparatus for testing a light emitting diode lamp and a method for operating the same.

In general, a light emitting diode (hereinafter, referred to as LED) is an electronic component emitting light through recombination of minority carriers (electrons) injected into a p-n junction structure of a semiconductor.

An LED lamp manufactured with such an LED not only has a small size and a long life span but also directly converts electric energy into light energy so that it consumes low electric power and emits light with high efficiency and high intensity.

The LED responds at a high speed. Therefore, the LED is used as a numeric display device and a display lamp of various electronic equipments, for example, a display device of a vehicle dashboard, a light source for optical communication, etc., and is also variously used as lighting means for home, vehicles, ships, traffic signals, various guide lamps and refuge guide lamps and the like.

SUMMARY

One embodiment is a method for operating a test apparatus for an LED lamp. The method may include: forming a self-holding circuit by switching on a first switching means such that an up and down shifter provided in the test apparatus for the LED lamp moves down; moving down and stopping the up and down shifter from a determined initial position to a measurement position; measuring the quality of the LED lamp equipped with the test apparatus for the LED lamp; releasing the self-holding circuit by switching on the second switching means such that the up and down shifter moves up; and moving up and down shifter from the measurement position to the determined initial position.

Prior to the forming a self-holding circuit, the method may include inputting electric power such that at least one up and down shifter among a plurality of the up and down shifters provided in the test apparatus for the LED lamp moves up and down.

In the moving down and stopping the up and down shifter, the up and down shifter may stop through the sense of contact between a sensor and a portion of the LED lamp by the sensor provided in the test apparatus for the LED lamp. In the moving down and stopping the up and down shifter, the up and down shifter may move down from the determined initial position to the measurement position in which the up and down shifter contacts with a socket of the LED lamp, and then the up and down shifter may stop.

In measuring the quality of the LED lamp, the quality of the LED lamp may be measured in a state where the LED lamp is lighted.

In measuring the quality of the LED lamp, the quality of the LED lamp may be measured when a first setup time elapses after the up and down shifter stops.

In releasing the self-holding circuit, the self-holding circuit may be released when a second setup time elapses after the quality of the LED lamp is measured in the measuring the quality of the LED lamp.

Another embodiment is an apparatus for testing an LED lamp. The apparatus may include: a secured seat on which the LED lamp is seated; an up and down shifter including a sensor; a controller controlling the up and down shifter, wherein the controller includes a first switch connected to an electric power, a fifth relay and a ninth contact, each of which is connected to the first switch, and a twelfth contact connected to the ninth contact, and wherein, when the first switch is switched on, the controller forms a self-holding circuit and moves down the up and down shifter, and wherein the controller includes a second switch connected to an electric power, and a seventh relay connected to the second switch, and wherein, when the second switch is switched on, the twelfth contact is opened and the controller releases the self-holding circuit, so that the up and down shifter moves up.

When the sensor senses that the up and down shifter arrives at a measurement position, the ninth relay connected to the fifth relay may be operated and a plurality of contacts connected to the ninth relay are closed, so that the up and down shifter may be stopped.

When a first determined time elapses after the sensor operates, the LED lamp may be lighted, and then the quality of the LED lamp may be measured.

The fifth relay and the ninth relay may be stopped by release of the self-holding circuit and a plurality of contacts are opened so that the up and down shifter may move up to an initial position.

DETAILED DESCRIPTION OF THE EMBODIMENTS

Figure 1:
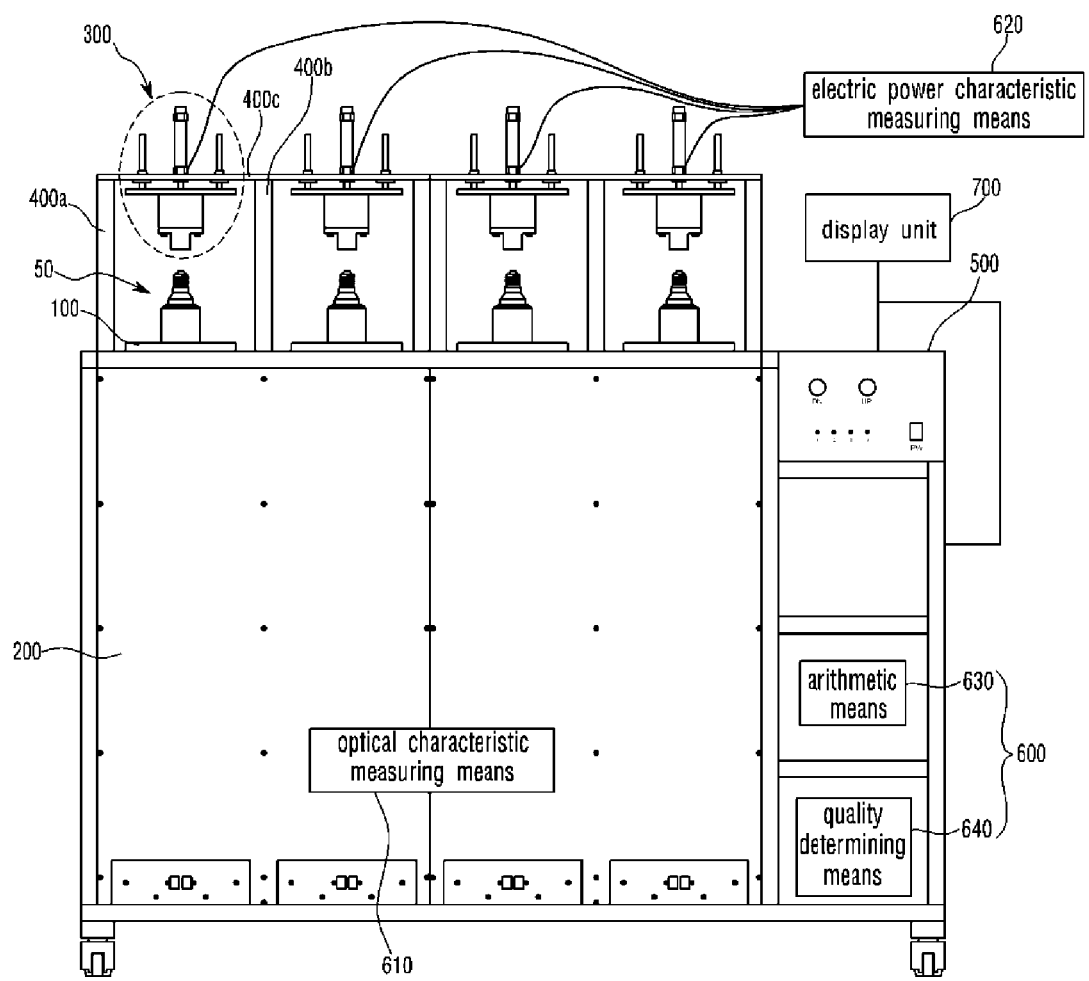
FIG. 1 is a front view of a test apparatus for an LED lamp according to an exemplary embodiment.

Hereinafter, an embodiment will be described with reference to the accompanying drawings. The embodiment can be variously transformed, and the scope of this embodiment is not limited to the following embodiment. The shapes and sizes of the components in the drawings may be exaggerated for clarity of the description. The components indicated by the same reference numerals in the drawing correspond to the same components.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

FIG. 1 is a front view of a test apparatus for an LED lamp according to an exemplary embodiment. Referring to FIG. 1, the test apparatus for the LED lamp 50 may include a secured seat 100, an up and down shifter 300, a controller 500, a measurer 600 and a display unit 700.

The test apparatus may include the secured seat 100 placed on the upper surface of a first body 200 so as to test the LED lamp. The secured seat 100 may include a groove into which the LED lamp 50 is inserted.

Plate type vertical support members 400a and 400b may be arranged on both sides of the secured seat 100 on the upper surface of the first body 200. A plate type horizontal support member 400c may be arranged on the upper surfaces of the vertical support members 400a and 400b. Here, the up and down shifter 300 may penetrate the horizontal support member 400c.

The LED lamp 50 may be tested through the following method. LEDs may be inserted into the groove of the secured seat 100, and electric power may be applied to the test apparatus by pressing a power (PW) switch. The up and down shifter 300 may be shifted from a determined initial position to a measurement position and may be stopped by pressing a down (DN) switch provided in the controller 500 of the test apparatus, and then the quality of the LED lamp 50 can be tested through the measurer 600. After the quality of the LED lamp 50 is tested, the display unit 700 may display whether the tested quality is good or poor. The display unit 700 may be connected to the controller 500 and the measurer 600. Here, the measurer 600 may receive measured values from both equipment (not shown) for measuring the optical characteristics, for example, an illuminometer, etc., disposed on the inner basal surface of the first body 200 and equipment (not shown) for measuring electric power characteristics, for example, a power meter connected to the up and down shifter 300. It is possible to substitute the equipment for measuring the optical characteristics and the equipment for measuring electric power characteristics with a measuring apparatus.

After the LED lamp 50 is tested, the up and down shifter 300 may be shifted from the measurement position to the determined initial position and stopped by an UP switch provided in the controller 500. The up and down shifter 300 may be shifted up and down by supplying fluid pressure or pneumatic pressure to a cylinder provided to the inside of the up and down shifter 300. It is possible to substitute the equipment for measuring the optical characteristics and the equipment for measuring electric power characteristics with a measuring apparatus.

In the test of the LED lamp 50, a plurality of the LED lamps 50 can be tested. In the embodiment, four LED lamps 50 can be simultaneously tested. It is also possible to test one to three LED lamps 50 instead of simultaneously testing four LED lamps 50. Besides, the embodiment may be changed such that various numbers of the LED lamps 50 can be tested without being limited to a specific number of the LED lamps 50.

Figure 2:
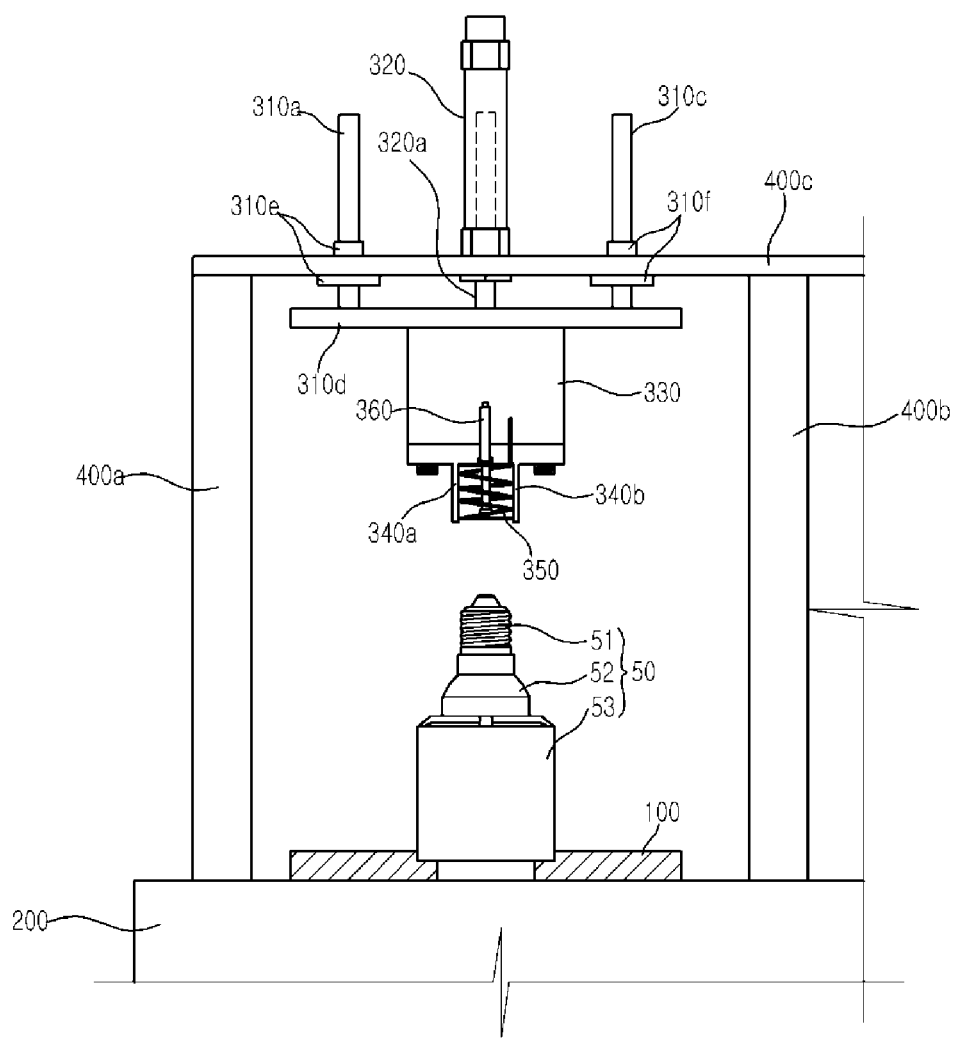
FIG. 2 is a cross sectional view of the test apparatus for the LED lamp placed in an initial position in accordance with an exemplary embodiment.
Figure 3:
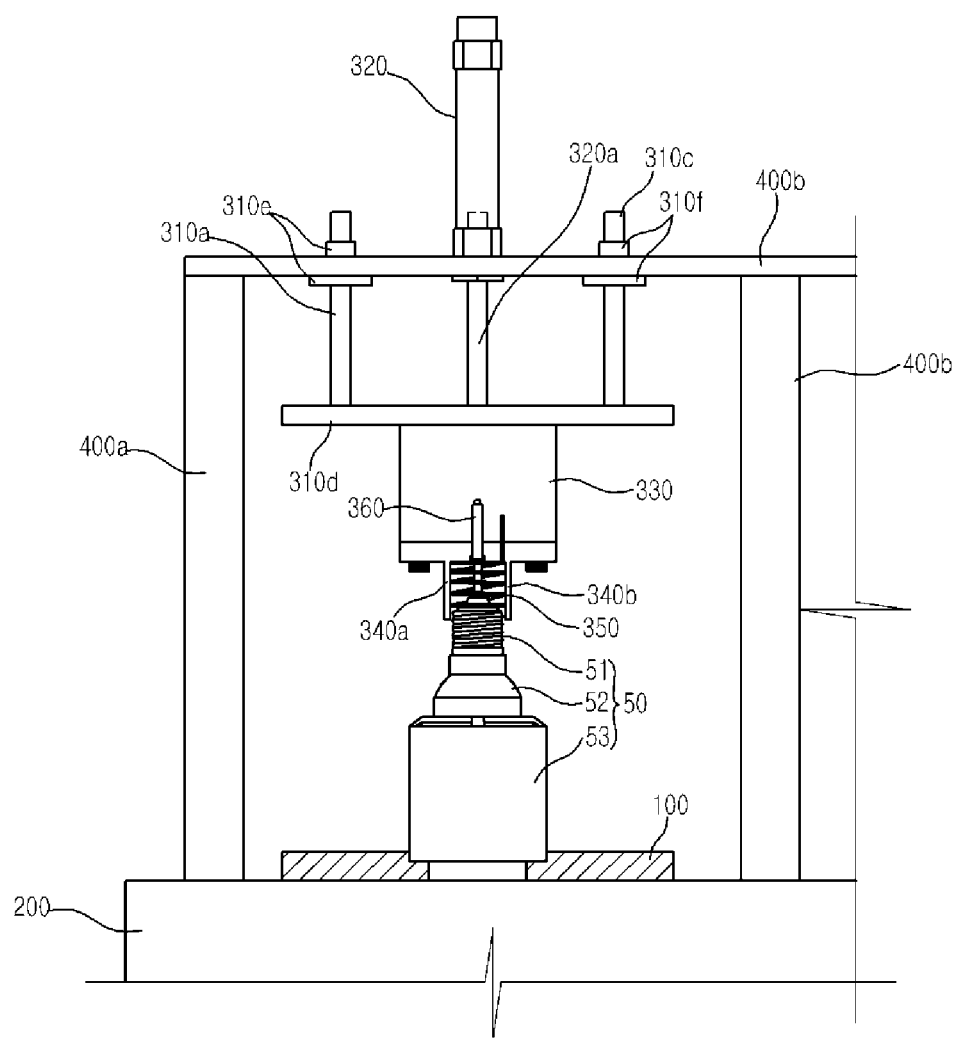
FIG. 3 is a cross sectional view of the test apparatus for the LED lamp placed in a measurement position in accordance with an exemplary embodiment.

FIG. 2 is a cross sectional view of the test apparatus for the LED lamp placed in an initial position in accordance with an exemplary embodiment. FIG. 3 is a cross sectional view of the test apparatus for the LED lamp placed in a measurement position in accordance with an exemplary embodiment.

When the test apparatus is placed in the initial position, as shown in FIG. 2, the lower part of a sensor 360 of the up and down shifter 300 may be spaced from the upper part of a socket 51 of the LED lamp 50. When the test apparatus is placed in the measurement position, as shown in FIG. 3, the lower part of a sensor 360 of the up and down shifter 300 may come in contact with the upper part of a socket 51 of the LED lamp 50.

When the lower part of the sensor 360 contacts with the upper part of the socket 51 of the LED lamp 50, the sensor 360 may transfer a LED lamp 50 detection signal to the measurer 600 shown in FIG. 1. The measurer 600 may comprehensively measure the quality of the LED lamp 50 and display the measurement result on the display unit 700. That is, the up and down shifter 300 may be shifted by as much as the height adjusted by the sensor 360 and contacts with the socket 51 so that electric power is may be applied to the lamp. The characteristic value of light irradiated downward may be measured by the illuminometer disposed on the inner basal surface of the first body 200. Simultaneously with this, the electric power characteristic value of the lamp may be measured by the power meter connected to the up and down shifter 300.

Referring to FIGS. 2 and 3, the LED lamp 50 may include the socket 51, a lamp 52 and a heat radiating part 53. The lamp 52 may be inserted into the secured seat 100. The LED lamp 50 may be inserted into the groove of the secured seat 100 in order to test the LED lamp 50.

The plate type vertical support members 400a and 400b may be placed on both sides of the secured seat 100 on the upper surface of the first body 200. The plate type horizontal support member 400c may be placed on the upper surface of the vertical support members 400a and 400b.

The horizontal support member 400c may include a cylinder 320 and guide rods 310a and 310c. The cylinder 320 may penetrate a hole formed in the horizontal support member 400c and moves up and down. The guide rods 310a and 310c may be arranged on both sides of the cylinder 320 in parallel with a longitudinal direction of the cylinder 320. More specifically, a piston 320a of the cylinder 320 may be vertically reciprocated through the hole formed in the horizontal support member 400c. The guide rods 310a and 310c can easily move in a sliding way through bearings 310e and 310f provided penetrating the horizontal support member 400c when the piston 320a of the cylinder 320 is vertically reciprocated.

In addition, a plate type horizontal member 310d may be attached to the lower surfaces of the cylinder 320 and the guide rods 310a and 310c. A second body 330 may be attached to the lower surface of the horizontal member 310d. Here, it is also possible that the second body 330 is horizontally lengthened and is attached to the lower surfaces of the cylinder 320 and the guide rods 310a and 310c instead of attaching the horizontal member 310d to the lower surfaces of the cylinder 320 and the guide rods 310a and 310c (FIGS. 2 and 3 show that the horizontal member 310d is attached). Here, since the horizontal member 310d may be attached to the lower surfaces of the cylinder 320 and the guide rods 310a and 310c, the cylinder 320 and the guide rods 310a and 310c may be fixed by the horizontal member 310d and it is unnecessary to increase the size of the second body 330.

The sensor 360 may be inserted into the lower part of the second body 330. The lower part of the sensor 360 may be surrounded by an elastic member 350 such as a spring. The elastic member 350 may protect the sensor 360 and provides an elastic force to the up and down shifter when the up and down shifter moves up.

Guides 340a and 340b may be formed on both sides of the elastic member 350. The guides 340a and 340b may prevent the elastic member 350 from meandering. The guides 340a and 340b allow the elastic member 350 to vertically move up and down within the inside of the guides 340a and 340b.

Figure 4:
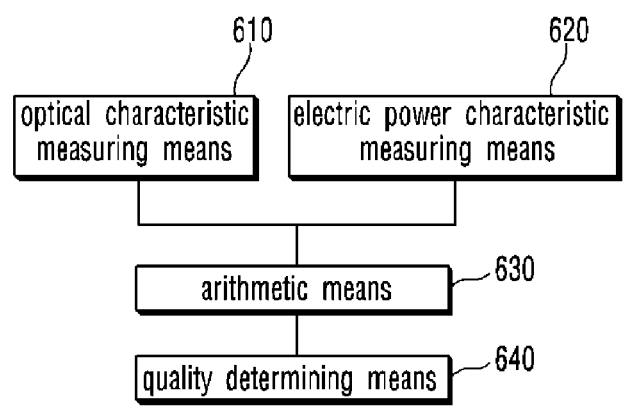
FIG. 4 shows an internal configuration of the test apparatus for the LED lamp of FIG. 1.

FIG. 4 shows an internal configuration of the test apparatus for the LED lamp of FIG. 1. Referring to FIG. 4, the test apparatus for the LED lamp may include an optical characteristic measuring means 610, an electric power characteristic measuring means 620, an arithmetic means 630, and a quality determining means 640.

The optical characteristic measuring means 610 measures an optical characteristic value of the LED lamp. The electric power characteristic measuring means 620 includes, for example, a power meter. The optical characteristic value may be obtained by measuring at least one selected from among illumination, chromaticity, color coordinates, and color temperature of the LED lamp. The optical characteristic measuring means 610 may include, for example, the illuminometer (which may be referred to as a color temperature meter). Another kind of optical characteristic measuring means, for example, a luminance meter can be used as an optical characteristic measuring means. The illuminometer may measure the illumination, chromaticity, color coordinates, and color temperature at a time. The response of a preferred illuminometer closely corresponds to that of a human being.

The optical characteristic value which the illuminometer can measure, as generally known, Ex[lx], x, y, u', v', X, Y, Z, $T_{CP}[K]$. Here, Ex[lx] indicates illuminance and x, y, u', and v' indicate chromaticity. X, Y, and Z indicate color coordinates. $T_{CP}[K]$ indicates color temperature.

The electric power characteristic measuring means 620 may measure the electric power characteristic value of the LED lamp. The electric power characteristic measuring means 620 may include, for example, a power meter. The electric power characteristic value may be obtained by measuring at least one selected from among output voltage, power factor, power consumption, total harmonic distortion (THD) of the output voltage, or an input current of the LED lamp.

Through a predetermined numerical expression for obtaining a value for determining whether the quality of the LED lamp is good or poor based on the optical characteristic value and the electric power characteristic value, the arithmetic means 630 may convert the optical characteristic value and the electric power characteristic value into values for determining whether the quality of the LED lamp is good or poor. The predetermined numerical expression (i.e., a conversion expression) may include a numerical expression for obtaining the speed of light, color temperature, light efficiency, color coordinate X, and color coordinate Y. For example, numerical expressions related to the matters described above are will be described in the following equations 1 to 5.

| speed of light=$EX[lx] \times 1$ | Equation (1) |
|---|---|
| color temperature=$Tcp+2$ | Equation (2) |
| light efficiency=speed of light/power consumption× correlation coefficient | Equation (3) |
| color coordinate X=$X+1$ | Equation (4) |
| color coordinate Y=$Y+1$ | Equation (5) |

The quality determining means 640 may determine whether the value for determining whether the quality of the lamp is good or poor is within a predetermined range. That is, if the value is within the predetermined range, the quality determining means 640 may determine that the quality of the lamp is good. If the value is not within the predetermined range, the quality determining means 640 may determine that the quality of the lamp is poor. The determining value for the quality of the lamp may include at least one of the speed of light, color temperature of light, light efficiency, color coordinate X, and color coordinate Y of the LED lamp. If all the determining values for the quality of the lamp are within the predetermined range, the quality determining means 640 may determine that the quality of the LED lamp is good. This means that if any one of the determining values for the quality of the LED lamp is not within the predetermined range, corresponding optical characteristic or electric power characteristic is not satisfied, so that the quality determining means 640 determines that the quality of the LED lamp is poor.

In this case, in order to determine the quality of the LED lamp in accordance with a user's selection, the quality determining means 640 can make use of not only the speed of light, a color temperature of light, a light efficiency, a color coordinate but also a value measured by the optical characteristic measuring means 610 or the electric power characteristic measuring means 620.

Figure 5:
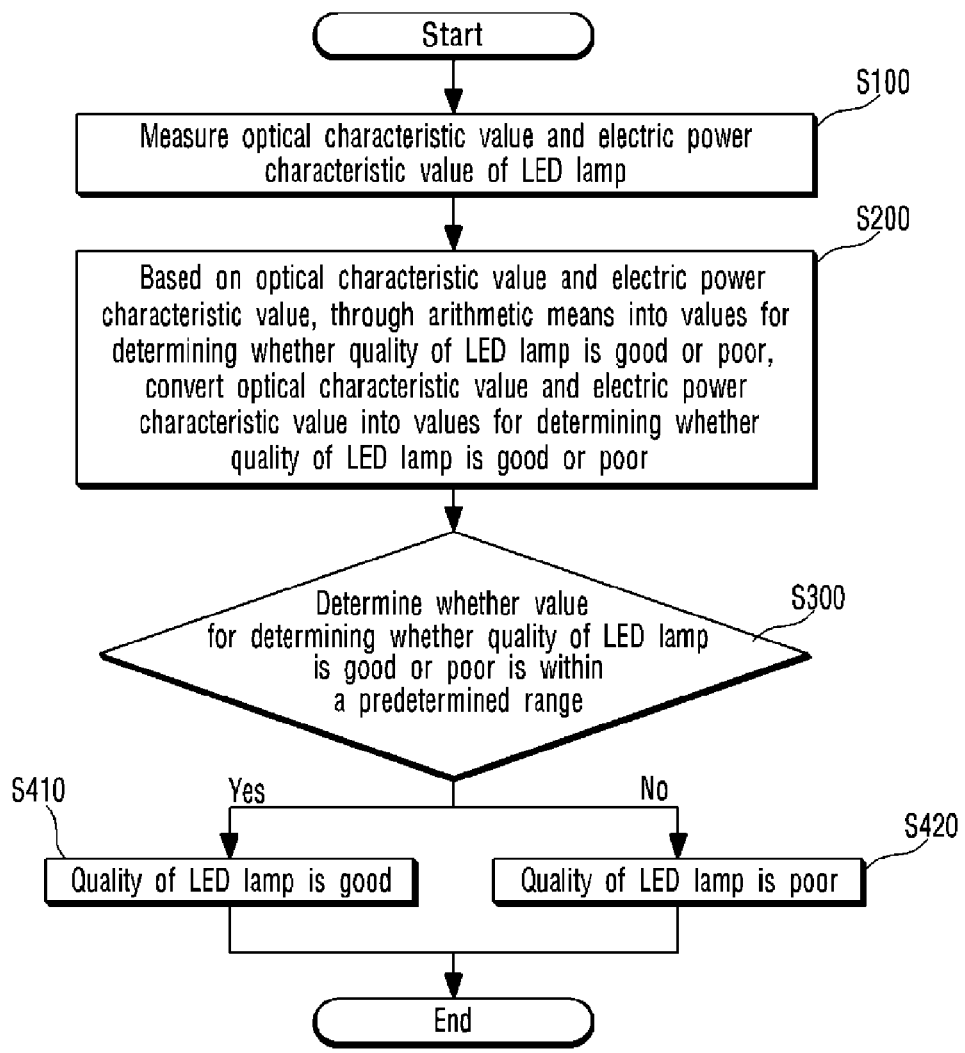
FIG. 5 is a flowchart showing a method for testing the LED lamp according to an exemplary embodiment.

FIG. 5 is a flowchart showing a method for testing the LED lamp according to an exemplary embodiment. FIG. 5 together with FIG. 4 will be described.

First, the optical characteristic value of the LED lamp may be measured by using the optical characteristic measuring means 610 and the electric power characteristic value of the LED lamp may be measured by using the electric power characteristic measuring means 620 (S100).

After the steps of S100 are completed, through a predetermined numerical expression for obtaining the value for determining whether the quality of the LED lamp is good or poor based on the optical characteristic value and the electric power characteristic value, the optical characteristic value and the electric power characteristic value may be converted by the arithmetic means 630 into the values for determining whether the quality of the LED lamp is good or poor (S200). The predetermined numerical expression may provide a standard for allowing a user to determine whether the quality of the LED lamp is good or poor in accordance with test data collected through repetitive measurements. That is, the predetermined numerical expression may change according to the kind of the LED lamp.

For example, in conventional technology, testing the quality of the lamp is performed by using a speed of light, a color temperature, light efficiency or a color coordinate value and the like which are directly measured by an integrating sphere, etc. Here, when, by using data repeatedly measured several times, the optical characteristic values measured by the illuminometer and the like are may be compared with values actually measured by an integrating sphere, a certain correlation is obtained. Based on such a constant correlation, the values measured by using only the optical characteristic measuring means 610 such as the illuminometer of this embodiment may be converted into the values measured by an integrating sphere, so that the converted values can be readily used to determine whether the quality of the LED lamp is good or poor.

After the step of S200, the quality determining means 640 may determine whether the value for determining whether the quality of the lamp is good or poor is within a predetermined range (S300). That is, if the value is within the predetermined range, the quality determining means 640 may determine that the quality of the lamp is good (S410). If the value is not within the predetermined range, the quality determining means 640 may determine that the quality of the lamp is poor (S420).

This embodiment provides an LED lamp testing method described above through the steps of S100 to S420, thereby overcoming problems, for example, excessive test time, excessive test cost and impossibility of a total test which are generated by using an integrating sphere.

Figure 6:
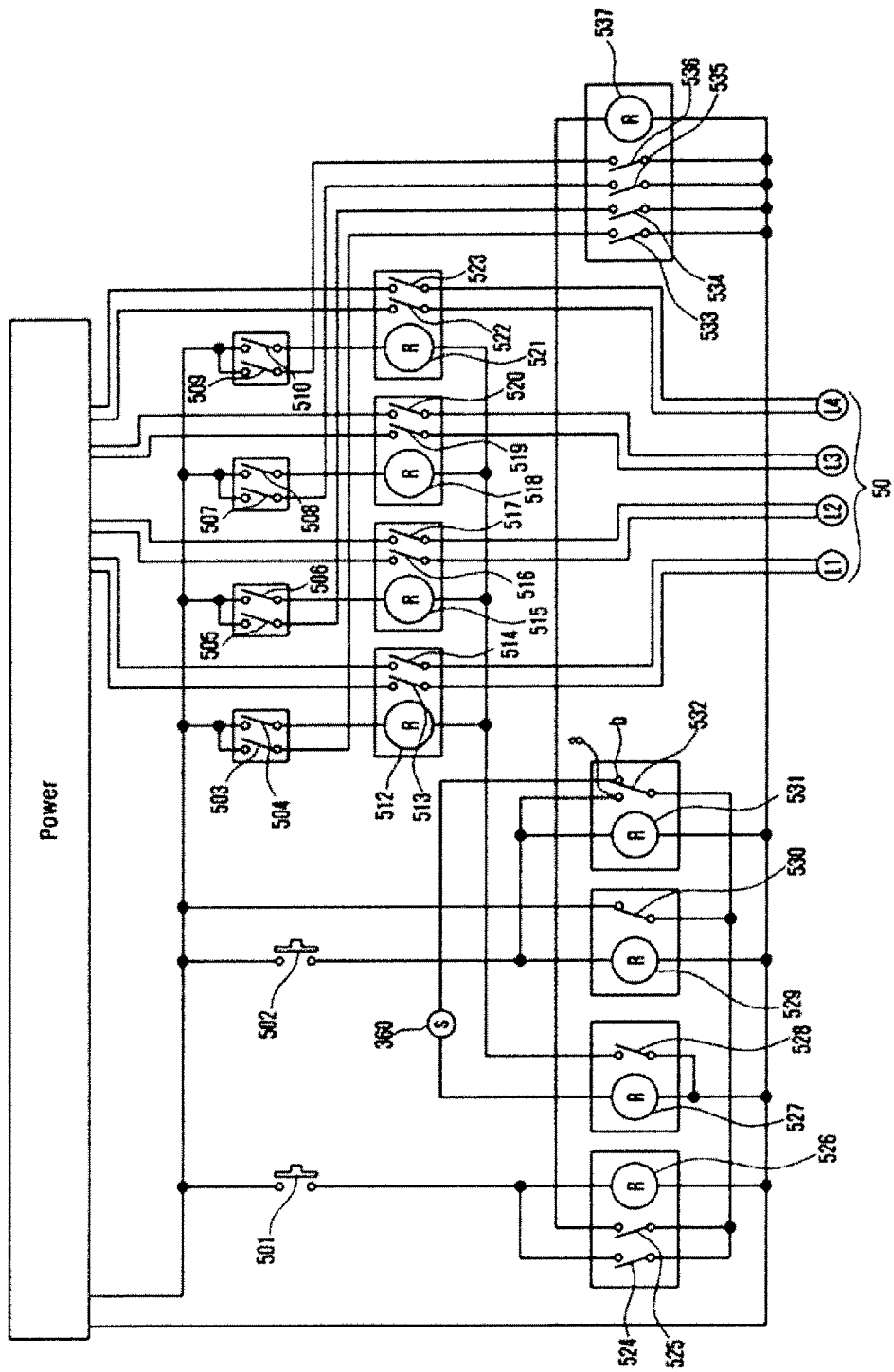
FIG. 6 is an internal circuit diagram of the test apparatus for the LED lamp according to an exemplary embodiment.

FIG. 6 is an example of an internal circuit diagram of the test apparatus for the LED lamp. Referring to FIG. 6 together with FIG. 1, the operation of the internal circuit configured in the controller 500 of FIG. 1 will be described.

Referring to FIG. 6, the controller 500 may include a first switching means 501 and a second switching means 502, a third to a tenth switching means 503 to 510, a first to a seventeenth contacts 513, 514, 516, 517, 519, 520, 522 to 525, 528, 530, and 532 to 536, a first to a ninth relays 512, 515, 518, 521, 526, 527, 529, 531, and 537, and the LED lamp 50. The up and down shifter 300 may receive electric power from a power supply and move down. Then, the lower part of the sensor 360 of the up and down shifter 300 may contact with the upper part of the socket 51 of the LED lamp 50, and then electric power may be applied to the LED lamp 50. At this time, the measurer 600 may measure the quality of the LED lamp 50 through the use of values measured by the illuminometer or the power meter which may constitute the test apparatus for the LED lamp. When the up and down shifter 300 moves up, the lower part of the sensor 360 may be separated from the upper part of the socket 51 of the LED lamp 50.

The test apparatus for the LED lamp may have the following exemplary operating method.

Step 1: A self-holding circuit is formed by switching on the first switching means 501 such that the up and down shifter 300 provided in the test apparatus for the LED lamp moves down.

Step 2: The up and down shifter 300 moves down from the determined initial position to the measurement position and stops.

Step 3: The quality of the LED lamp 50 is measured, which is equipped with the test apparatus for the LED lamp.

Step 4: The self-holding circuit is released by switching on the second switching means 502 such that the up and down shifter 300 moves up.

Step 5: The up and down shifter 300 moves up from the measurement position to the determined initial position.

The aforesaid exemplary operating method of the test apparatus for the LED lamp will be described in detail. In order to measure the qualities of four LED lamps 50, a user is required to switch the third to the tenth switching means 503 to 510, i.e., passive switching elements, on. If the quality of only one LED lamp is measured, only the third to the fourth switching means 503 and 504 are switched on.

The first to the tenth switching means 501 to 510 are may be constituted by a passive switching element which is operated by a user if necessary. That is, electric power is input in such a manner that at least one up and down shifter 300 among a plurality of the up and down shifters 300 moves up and down.

First, when a user switches the first switching means 501, i.e., a passive switching element, on such that the up and down shifter 300 provided in the test apparatus for the LED lamp may move down, the ninth contact 524 may closed by the fifth relay 526 and electric current flows through the twelfth contact 530, so that the self-holding circuit is formed. The electric current enabling the up and down shifter 300 to move down may be allowed to continuously flow through the fifth relay 526 by forming the self-holding circuit.

The fifth relay 537 is operated by the fifth relay 526. Then, the fourth to the seventeenth contacts 533 to 536 are closed so that the up and down shifter 300 moves down from the determined initial position to the measurement position (i.e., a position in which the up and down shifter 300 contacts with the socket 51 of the LED lamp 50) and stops. In other words, the up and down shifter 300 may move down in a direction of the secured seat 100 into which the LED lamp 50 is inserted and stops.

Further, when the tenth contact 525 is closed by the fifth relay 526, electric current may flow through the thirteenth contact 532 and the sensor 360 is operated. When a first setup time elapses, the eleventh contact 528 may be closed by the sixth relay 527, i.e., a timer relay, and the first to the fourth relays 512, 515, 518, and 521 may be operated. Thus, the first to the eighth contacts 513, 514, 516, 517, 519, 520, 522, and 523 may be closed and the LED lamp 50 is lighted. When the first setup time elapses, the lower part of the sensor 360 provided in the up and down shifter 300 may contact with the upper part of the socket 51 of the LED lamp 50 so that the LED lamp 50 is lighted. Here, the LED lamp 50 is tested by the illuminometer and the power meter. Additionally, various characteristic values may be measured, collected, and transferred to the measurer 600.

Meanwhile, a user switches the second switching means 502, i.e., a passive switching element, on such that the up and down shifter 300 may be provided in the test apparatus for the LED lamp moves up. Here, when a second setup time elapses, the seventh relay 529, i.e., a timer relay, may be operated and the twelfth contact 530 is opened. Therefore, the self-holding circuit formed by switching on the first switching means 501 is released. The release of the self-holding circuit may cause the fifth relay 526 and the ninth relay 537 not to be operated. Since the ninth relay 537 does not operated, the fourteenth to the seventeenth contacts 533 to 536 may be opened. Therefore, the up and down shifter 300 may move up from the measurement position to the determined initial position.

Further, when the thirteenth contact 525 is closed from "b" to "a" by the eighth relay 531, the operation of the sensor 360 may be released and the sixth relay 527, i.e., a timer relay, is not operated. Thus, the eleventh contact may be opened and the first to the fourth relays 513, 514, 516, 517, 519, 520, 522, and 523 are not operated. Accordingly, the first to the eighth contacts 513, 514, 516, 517, 519, 520, 522, and 523 may be opened and the LED lamp 50 is turned off. When the LED lamp 50 is turned off, the up and down shifter 300 may move up from the measurement position to the determined initial position.

This embodiment is not limited to the embodiment described above and the accompanying drawings. The scope of rights of this embodiment is intended to be limited by the appended claims. It will be understood by those skilled in the art that various substitutions, modification and changes in form and details may be made therein without departing from the spirit and scope of this embodiment as defined by the appended claims.

What is claimed is:

1. A method for operating a test apparatus for an LED lamp, the method comprising:
   forming a self-holding circuit by switching on a first switching means such that an up and down shifter provided in a test apparatus for an LED lamp moves down;
   moving down and stopping the up and down shifter from a determined initial position to a measurement position;
   measuring a quality of the LED lamp equipped with the test apparatus for the LED lamp, wherein the quality of the LED lamp includes at least one selected from among illumination, chromaticity, a color coordinate, and a color temperature of the LED lamp;
   releasing the self-holding circuit by switching on a second switching means such that the up and down shifter moves up; and moving up the up and down shifter from the measurement position to the determined initial position,
wherein in moving down and stopping the up and down shifter, the up and down shifter moves down from the determined initial position to the measurement position in which the up and down shifter contacts with a socket of the LED lamp, and then the up and down shifter stops.

2. The method of claim 1, further comprising inputting electric power such that at least one up and down shifter among a plurality of the up and down shifters provided in the test apparatus for the LED lamp moves up and down, prior to forming the self-holding circuit.

3. The method of claim 1, wherein in the moving down and stopping the up and down shifter, the up and down shifter stops through a sense of contact between a sensor and a portion of the LED lamp by the sensor provided in the test apparatus for the LED lamp.

4. The method of claim 1, wherein in the measuring the quality of the LED lamp, the quality of the LED lamp is measured in a state where the LED lamp is lighted.

5. The method of claim 1, wherein in the measuring the quality of the LED lamp, the quality of the LED lamp is measured when a first setup time elapses after the up and down shifter stops.

6. The method of claim 1, wherein in the releasing the self-holding circuit, the self-holding circuit is released when a second setup time elapses after the quality of the LED lamp is measured in the measuring the quality of the LED lamp.

7. The method of claim 1, wherein during the step of measuring the quality of the LED lamp, the quality of the LED lamp is measured when the lower part of the up and down shifter contacts with the upper part of the LED lamp.

8. The method of claim 1, further comprising:
displaying a measurement result.

9. An apparatus for testing an LED lamp, the apparatus comprising:
a secured seat on which an LED lamp is seated;
an up and down shifter comprising a sensor;
a controller controlling the up and down shifter, wherein the controller comprises:
a first switch connected to an electric power,
a fifth relay and a ninth contact, each of which is connected to the first switch, and
a twelfth contact connected to the ninth contact,
wherein, when the first switch is switched on, the controller forms a self-holding circuit and moves down the up and down shifter,
wherein the controller comprises a second switch connected to electric power, and a seventh relay connected to the second switch, and
wherein, when the second switch is switched on, the twelfth contact is opened and the controller releases the self-holding circuit, so that the up and down shifter moves up,
wherein, when a first determined time elapses after the sensor operates, the LED lamp is lighted, and then a quality of the LED lamp is measured, and
wherein the quality of the LED lamp includes at least one selected from among illumination, chromaticity, a color coordinate, and a color temperature of the LED lamp.

10. The apparatus of claim 9, wherein, when the sensor senses that the up and down shifter arrives at a measurement position, the ninth relay connected to the fifth relay is operated and a plurality of contacts connected to the ninth relay are closed, so that the up and down shifter is stopped.

11. The apparatus of claim 9, wherein the fifth relay and the ninth relay are stopped by release of the self-holding circuit and a plurality of contacts are opened so that the up and down shifter moves up to an initial position.

12. The apparatus of claim 9, further comprising a display unit which displays a measurement result.

13. A method for operating a test apparatus for an LED lamp, the method comprising:
forming a self-holding circuit by switching on a first switching means such that an up and down shifter provided in the test apparatus for the LED lamp moves down;
moving down and stopping the up and down shifter from a determined initial position to a measurement position;
measuring a quality of the LED lamp equipped with the test apparatus for the LED lamp, wherein the quality of the LED lamp includes at least one selected from among illumination, chromaticity, a color coordinate, and a color temperature of the LED lamp;
releasing the self-holding circuit by switching on the second switching means such that the up and down shifter moves up; and
moving up the up and down shifter from the measurement position to the determined initial position,
wherein during the step of measuring the quality of the LED lamp, the quality of the LED lamp is measured when a first setup time elapses after the up and down shifter stops.

14. The method of claim 13, further comprising:
inputting electric power such that at least one up and down shifter among a plurality of the up and down shifters provided in the test apparatus for the LED lamp moves up and down prior to the step of forming a self-holding circuit.

15. The method of claim 13, wherein in during the step of moving down and stopping the up and down shifter, the up and down shifter stops through a sense of contact between a sensor and a portion of the LED lamp by the sensor provided in the test apparatus for the LED lamp.

16. The method of claim 13, wherein during the step of measuring the quality of the LED lamp, the quality of the LED lamp is measured in a state where the LED lamp is lighted.

17. The method of claim 13, wherein during the step of releasing the self-holding circuit, the self-holding circuit is released when a second setup time elapses after the quality of the LED lamp is measured while measuring the quality of the LED lamp.

18. The method of claim 13, wherein during the step of measuring the quality of the LED lamp, the quality of the LED lamp is measured when a lower part of the up and down shifter contacts with an upper part of the LED lamp.

19. The method of claim 13, further comprising:
displaying a measurement result.

* * * * *